(12) United States Patent
Cha et al.

(10) Patent No.: US 6,432,797 B1
(45) Date of Patent: Aug. 13, 2002

(54) SIMPLIFIED METHOD TO REDUCE OR ELIMINATE STI OXIDE DIVOTS

(75) Inventors: Randall Cher Liang Cha; Tae Jong Lee; Alex See, all of Singapore (SG); Lap Chan, San Francisco, CA (US); Yeow Kheng Lim, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/768,487

(22) Filed: Jan. 25, 2001

(51) Int. Cl.[7] .............................................. H01L 21/76
(52) U.S. Cl. ..................... 438/424; 438/692; 438/775
(58) Field of Search ............................ 216/38, 39, 87; 438/424, 691, 692, 359, 221, 775

(56) References Cited

U.S. PATENT DOCUMENTS

| | | | |
|---|---|---|---|
| 5,173,439 A | * 12/1992 | Dash et al. ................. | 438/424 |
| 5,646,063 A | 7/1997 | Mehta et al. ............... | 438/425 |
| 5,665,202 A | * 9/1997 | Subramanian et al. ...... | 438/692 |
| 5,728,621 A | * 3/1998 | Zheng et al. ............... | 438/427 |
| 5,780,346 A | * 7/1998 | Arghavani et al. .......... | 438/296 |
| 5,801,082 A | 9/1998 | Tseng ......................... | 438/424 |
| 5,807,784 A | 9/1998 | Kim ............................ | 438/423 |
| 5,923,993 A | * 7/1999 | Sahota ........................ | 438/427 |
| 6,001,708 A | 12/1999 | Lin et al. .................... | 438/435 |
| 6,245,635 B1 | * 6/2001 | Lee ............................. | 438/407 |

FOREIGN PATENT DOCUMENTS

DE         19939597 A1   *   3/2001  ......... H01L/21/762

* cited by examiner

Primary Examiner—Carl Whitehead, Jr.
Assistant Examiner—Toniae M. Thomas
(74) Attorney, Agent, or Firm—George O. Saile; Rosemary L. S. Pike

(57) ABSTRACT

A method for forming shallow trench isolation wherein oxide divots at the edge of the isolation and active regions are reduced or eliminated is described. A trench is etched into a semiconductor substrate. An oxide layer is deposited overlying the semiconductor substrate and filling the trench. Nitrogen atoms are implanted into the oxide layer overlying the trench. The substrate is annealed whereby a layer of nitrogen-rich oxide is formed at the surface of the oxide layer overlying the trench. The oxide layer is planarized to the semiconductor substrate wherein the nitrogen-rich oxide layer is planarized more slowly than the oxide layer resulting in a portion of the oxide layer remaining overlying the trench after the oxide layer overlying the semiconductor substrate has been removed wherein the portion of the oxide layer remaining provides a smooth transition between the shallow trench isolation and the active areas completing the formation of shallow trench isolation in the fabrication of an integrated circuit device.

31 Claims, 3 Drawing Sheets

SIMPLIFIED METHOD TO REDUCE OR ELIMINATE STI OXIDE DIVOTS

BACKGROUND OF THE INVENTION (1) Field of the Invention

The present invention relates to the fabrication of integrated circuit devices, and more particularly, to a method of forming high quality shallow trench isolation (STI) in the fabrication of integrated circuits.

(2) Description of the Prior Art

Shallow trench isolation (STI) is often used in the fabrication of integrated circuits to separate active areas. After the trench has been filled with an oxide, nitride blocks resting on pad oxide layers over active areas typically serve as stopping layers for the chemical mechanical polishing (CMP) of the oxide to leave the oxide only in the trench. The removal of the nitride blocks later by wet chemical cleans, however, induces divots of varying depths to develop at the edges of the STI near the silicon active region.

FIG. 1 shows the STI region 20 formed in the semiconductor substrate 10. Pad oxide layer 12 and nitride blocking layer 14 are shown. The figure shows a stage near the end point of the CMP step. Next, wet nitride removal steps remove the nitride and a heavy oxide dip removes the pad oxide. Consequently, divots 22 are formed at the edges of the STI, as shown in FIG. 2. These divots are potential hidden nodes for suicides, and they are sometimes responsible for high field edge leakage if the source/drain junctions at these edges are shallow. That is, silicide will form within the divot and can grow steeply downwards at 28. It the elongated silicide is below the depth of the junctions 24, formed at a later step, there will be high leakage and possibly a short. The segregation of dopants, especially boron, at STI field edges reduces junction depth. After the junctions are silicided 26, the silicide formed by metal remaining at the STI divots 22, if they are show steep growth downwards, can become shorting routes 30 to the substrate. The consequence of this is large leakage currents from the source/drain junctions to the well or substrate.

A number of patents have addressed the formation of shallow trenches. U.S. Pat. No. 5,807,784 to Kim teaches an ion implant for oxidation within a trench, then oxide fill and CMP. U.S. Pat. No. 5,646,063 to Mehta et al shows an STI process with CMP. U.S. Pat. No. 5,801,082 to Tseng discloses a spin-on-glass coating and etchback for corner rounding of an STI. U.S. Pat. No. 6,001,708 to Liu et al discloses a nitride cap layer over an oxide trench fill to prevent dishing during CMP. Co-pending U.S. patent application Ser. No. 09/405,061 (CS-98-162) to L. C. Wee et al filed on Sep. 27, 1999 prevents the formation of oxide divots by forming oxide spacers on the nitride blocks and using a silicon soft sputter etch. Co-pending U.S. patent application Ser. No. 09/439,358 (CS-99-148) to H. T. Kim et al filed on Nov. 15, 1999 prevents the formation of oxide divots by depositing a polysilicon layer under the nitride blocks and oxidizing the polysilicon to protect the edges of the STI. All of these aforementioned methods use nitride blocks.

SUMMARY OF THE INVENTION

Accordingly, the primary object of the invention is to provide a process for forming shallow trench isolation in the fabrication of integrated circuits.

A further object of the invention is to provide a process for forming shallow trench isolation wherein oxide divots at the edge of the isolation and active regions are reduced or eliminated.

Still another object is to provide a process for forming shallow trench isolation without the use of a nitride blocking layer.

Yet another object is to provide a process for forming shallow trench isolation without the use of a nitride blocking layer wherein oxide divots at the edge of the isolation and active regions are reduced or eliminated.

Yet another object of the invention is to provide a process for forming shallow trench isolation without the use of a nitride blocking layer wherein a nitrogen ion implant is used to control the CMP process.

A still further object of the invention is to provide a process for forming shallow trench isolation without the use of a nitride blocking layer wherein a nitrogen ion implant is used to control the CMP process thereby reducing or eliminating oxide divots at the edge of the isolation and active regions.

In accordance with the objects of the invention, a method for forming shallow trench isolation wherein oxide divots at the edge of the isolation and active regions are reduced or eliminated is achieved. A trench is etched into a semiconductor substrate. An oxide layer is deposited overlying the semiconductor substrate and filling the trench. Nitrogen atoms are implanted into the oxide layer overlying the trench. The substrate is annealed whereby a layer of nitrogen-rich oxide is formed at the surface of the oxide layer overlying the trench. The oxide layer is planarized to the semiconductor substrate wherein the nitrogen-rich oxide layer is planarized more slowly than the oxide layer resulting in a portion of the oxide layer remaining overlying the trench after the oxide layer overlying the semiconductor substrate has been removed, completely or mostly removed, wherein the portion of the oxide layer remaining over the STI provides a smooth transition between the shallow trench isolation and the active areas completing the formation of shallow trench isolation in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
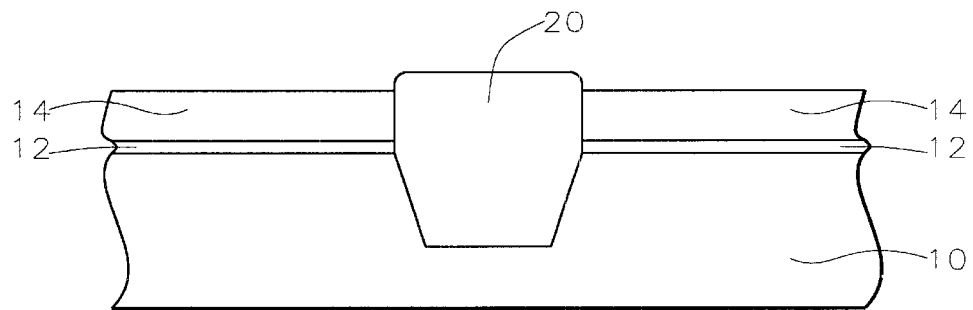
FIGS. 1 and 2 are cross-sectional representation of an embodiment of the prior art.
Figure 2:
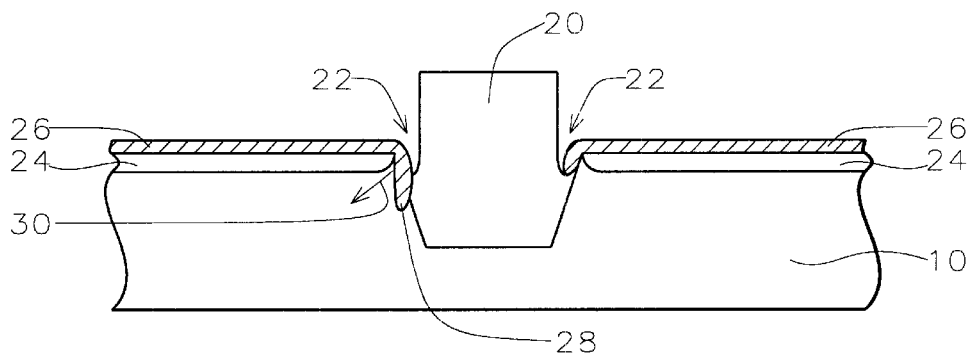
Figure 3:
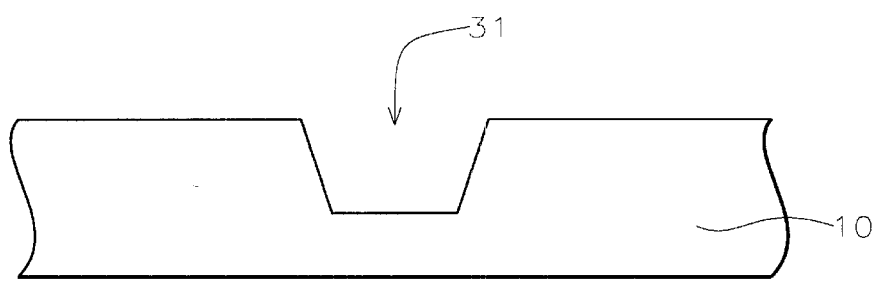
FIGS. 3 through 8 are cross-sectional representations of a preferred embodiment of the present invention.

The process of the present invention overcomes the divot issue by avoiding wet nitride cleans altogether. Referring now more particularly to FIG. 3, there is shown a semiconductor substrate 10. Pad oxide and nitride layers are not formed in the process of the present invention.

A photoresist mask is formed over the surface of the nitride layer with an opening where the shallow trench isolation region is to be formed. Using conventional photolithography and etching techniques, the semiconductor substrate exposed within the opening is etched into to a depth of between about 2500 and 3000 Angstroms to form a trench 31. The mask is removed.

Figure 4:
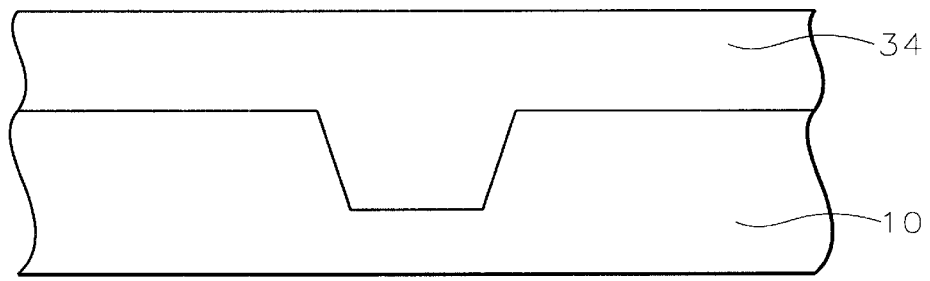

After a conventional cleaning step, the trench is filled with an oxide layer. Optionally, a layer of liner oxide, not shown, could be grown within the trench by thermal oxidation to a thickness of between about 150 and 250 Angstroms. This liner oxide can round the sharp corners of the trench. Then, an oxide layer 34 is deposited by chemical vapor deposition (CVD) or high density plasma (HDP) CVD over the surface of the substrate and filling the trench, as shown in FIG. 4. The oxide layer 34 has a thickness of between about 6000 and 8000 Angstroms. The oxide layer 34 is polished using CMP until it is planar, but still remains overlying the substrate 10.

Figure 5:
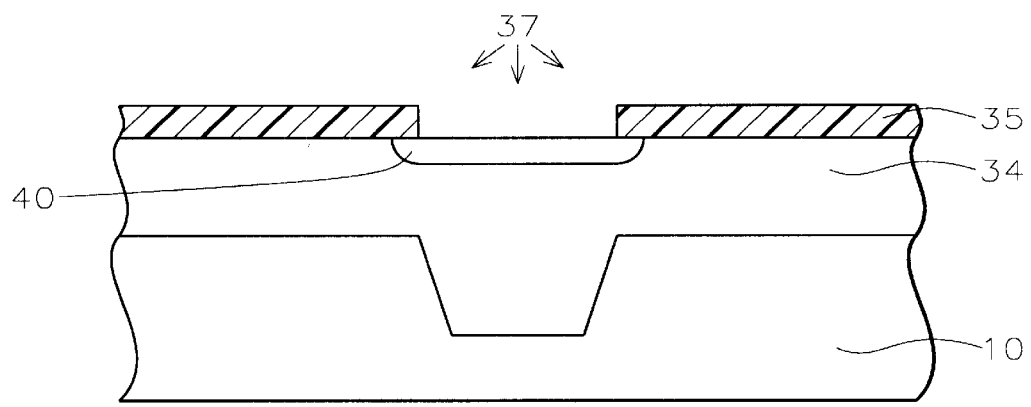

Referring to FIG. 5, an existing mask is employed to pattern a photoresist layer 35. This is the same mask as that used to pattern the STI trench. Now, a nitrogen ($N_2$) implantation 37 is performed using a tilt angle of between about 3 and 7 degrees at a high dosage of between about 1 E 16 to 1 E 18 atoms/cm$^2$ and energy of between about 5 and 20 KeV to infuse nitrogen into the oxide at the open window over the STI trench. The nitrogen atom implantation serves a two-fold purpose: 1) to introduce nitrogen into the exposed oxide and 2) to break the Si—O bonds and so create dangling silicon bonds for merging with nitrogen.

Figure 6:
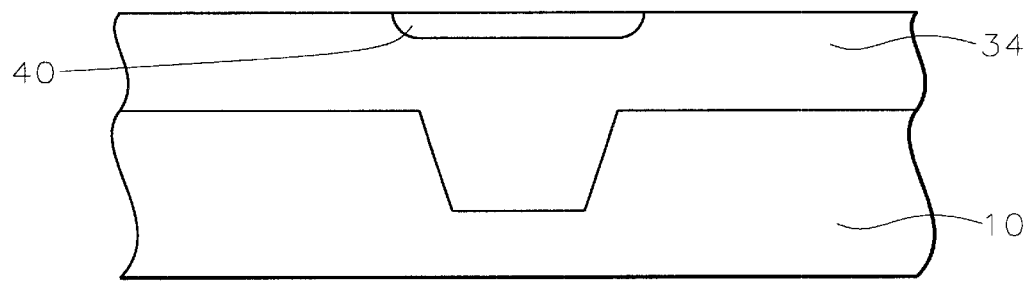

The photoresist mask 35 is stripped and the substrate is thermally annealed to convert the N-doped oxide to N-rich oxide thereby forming the nitrided (nitrogen-rich) oxide layer 40 at the top surface of the oxide layer above the trench, as shown in FIG. 6. The annealing can be performed in $O_2$, $N_2$, or any inert gas ambient at about 1000° C. for 5 to 15 minutes.

Alternatively, the $N_2$ implantation can be performed at high temperatures of between about 800 and 900° C. or just low enough for the $N_2$ to merge with the broken Si—O bonds. If this high temperature $N_2$ implantation is performed instead of the lower temperature implantation followed by annealing, the masking material must be a more thermally stable material than photoresist.

The nitrogen-rich region 40 has a thickness of between about 200 and 500 Angstroms. This step is similar to the pattern of a nitride block on the STI location. Thermal reflow, which occurs during thermal annealing, also improves planarity.

Figure 7:
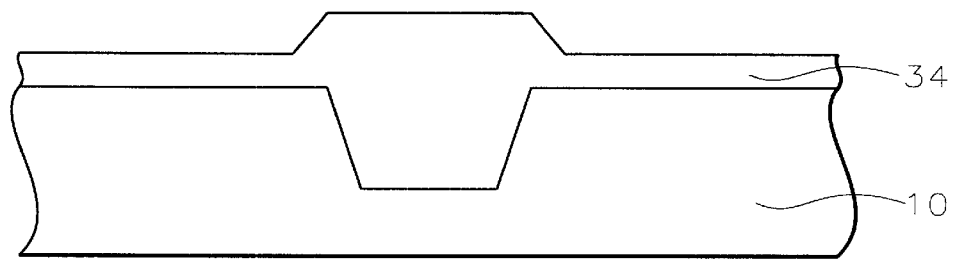
Figure 8:
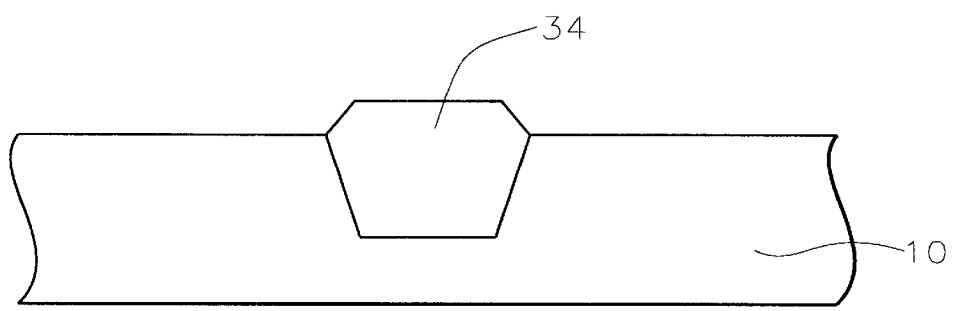

Referring now to FIG. 7, chemical mechanical polishing (CMP) is performed to planarize the oxide layer. The N-rich oxide portions 40 will be removed at a lower rate owing to better chemical resistance. This results in a thicker oxide at the STI with shoulders extending into the active area (because of the tilt angle implant). FIG. 7 shows a point in the CMP process in which most of the overlying oxide has been removed. CMP continues until the silicon substrate 10 is reached, as shown in FIG. 8. Or, preferably, CMP is stopped before the silicon substrate is reached in order to avoid damaging the substrate. A controlled oxide dip removes the remaining oxide over the substrate. For example, for about 100 to 300 Angstroms of silicon oxide, 10 to 20 seconds of dilute hydrofluoric acid will remove the remaining oxide.

Alternatively, instead of a CMP step, an oxide etch back step may be used. The N-rich oxide 40 will be etched more slowly than the undoped oxide 34. An oxide dry etch, for example using $CHF_3/CF_4$, $CF_4/O_2$, $CHF_3/O_2$, and so on, can be used.

The process of the present invention avoids wet nitride removal steps that result in oxide divots. The process of the invention results in a completed filled STI trench without divots or with divots of reduced depth, as shown in FIG. 8. The filled STI provides a smooth transition between the isolation and the active regions, thus avoiding the "kink" effect.

Figure 9:
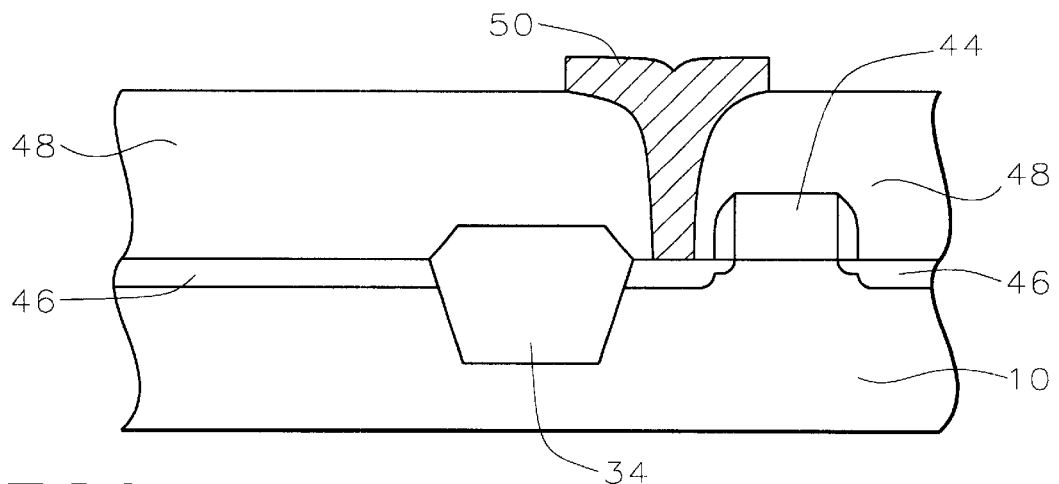
FIG. 9 is a cross-sectional representation of a completed integrated circuit device fabricated by the process of the present invention.

Processing continues as is conventional in the art. For example, as shown in FIG. 9, gate electrodes 44 and source and drain regions 46 may be formed in the active regions between isolation regions as is conventional in the art. Electrical contacts 50 may be made through dielectric isolation layer 48.

The process of the present invention results in the formation of shallow trench isolation (STI) having a smooth transition between the isolation region and active regions. Oxide divots at the edge of the STI region are eliminated or reduced.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation in the fabrication of an integrated circuit device comprising:

etching a trench into a semiconductor substrate;

depositing an oxide layer overlying said semiconductor substrate and filling said trench;

forming a layer of nitrogen-rich oxide at the surface of said oxide layer overlying said trench; and planarizing said trench-filling oxide layer to said semiconductor substrate wherein said nitrogen-rich oxide layer is planarized more slowly than said trench-filling oxide layer resulting in a portion of said trench-filling oxide layer remaining overlying said trench after said trench-filling oxide layer overlying said semiconductor substrate has been removed wherein said portion of said trench-filling oxide layer remaining provides a smooth transition between said shallow trench isolation and said active areas completing said formation of said shallow trench isolation in said fabrication of said integrated circuit device.

2. The method according to claim 1 wherein said trench has a depth of between about 2500 and 3000 Angstroms.

3. The method according to claim 1 further comprising forming a thermal oxide liner layer within said trench before said step of depositing said trench-filling oxide layer.

4. The method according to claim 1 wherein said trench-filling oxide layer is deposited by to a thickness of between about 6000 and 8000 Angstroms.

5. The method according to claim 1 wherein said step of forming said nitrogen-rich oxide layer comprises:

forming a photoresist mask overlying said trench-filling oxide layer having an opening over said trench;

implanting nitrogen atoms into said trench-filling oxide layer not covered by said photoresist mask;

removing said photoresist mask; and annealing said substrate whereby said layer of nitrogen-rich oxide is formed where said nitrogen atoms lie within said trench-filling oxide layer.

6. The method according to claim 1 wherein said step of forming said nitrogen-rich oxide layer comprises:

forming a mask overlying said trench-filling oxide layer having an opening over said trench;

implanting nitrogen atoms into said trench-filling oxide layer not covered by said mask at a temperature high enough whereby said layer of nitrogen-rich oxide is formed in said trench-filling oxide layer not covered by said mask; and removing said mask.

7. The method according to claim 1 wherein said nitrogen atoms are implanted at a dosage of between about 1 E 16 and 1 E 18 atoms/cm² at an energy of between 5 and 20 KeV and at a tilt angle of between about 3 and 7 degrees.

8. The method according to claim 1 wherein said nitrogen-rich oxide layer has a thickness of between about 200 and 500 Angstroms.

9. The method according to claim 1 wherein said step of planarizing said trench-filling oxide layer comprises chemical mechanical polishing (CMP).

10. The method according to claim 1 wherein said step of planarizing said trench-filling oxide layer comprises etch back using a dry oxide etch.

11. The method according to claim 1 further comprising fabricating semiconductor device structures in and on said semiconductor substrate between said shallow trench isolation.

12. A method of forming shallow trench isolation in the fabrication of an integrated circuit device comprising:
  etching a trench into a semiconductor substrate; depositing a trench-filling oxide layer overlying said semiconductor substrate and filling said trench;
  forming a photoresist mask overlying said trench-filling oxide layer having an opening over said trench;
  implanting nitrogen atoms into said trench-filling oxide layer not covered by said photoresist mask and annealing said substrate whereby a layer of nitrogen-rich oxide is formed at the surface of said trench-filling oxide layer overlying said trench;
  thereafter removing said photoresist mask; and
  planarizing said trench-filling oxide layer to said semiconductor substrate wherein said nitrogen-rich oxide layer is planarized more slowly than said trench-filling oxide layer resulting in a portion of said trench-filling oxide layer remaining overlying said trench after said trench-filling oxide layer overlying said semiconductor substrate has been removed wherein said portion of said trench-filling oxide layer remaining provides a smooth transition between said shallow trench isolation and said active areas completing said formation of said shallow trench isolation in said fabrication of said integrated circuit device.

13. The method according to claim 12 wherein said trench has a depth of between about 2500 and 3000 Angstroms.

14. The method according to claim 12 further comprising forming a thermal oxide liner layer within said trench before said step of depositing said trench-filling oxide layer.

15. The method according to claim 12 wherein said trench-filling oxide layer is deposited to a thickness of between about 6000 and 8000 Angstroms.

16. The method according to claim 12 wherein said nitrogen atoms are implanted at a dosage of between about 1 E 16 and 1 E 18 atoms/cm² at an energy of between 5 and 20 KeV and at a tilt angle of between about 3 and 7 degrees.

17. The method according to claim 12 wherein said nitrogen-rich oxide layer has a thickness of between about 200 and 500 Angstroms.

18. The method according to claim 12 wherein said step of planarizing said trench-filling oxide layer comprises chemical mechanical polishing (CMP).

19. The method according to claim 12 wherein said step of planarizing said trench-filling oxide layer comprises etch back using a dry oxide etch.

20. The method according to claim 12 further comprising fabricating semiconductor device structures in and on said semiconductor substrate between said shallow trench isolation.

21. A method of forming shallow trench isolation in the fabrication of an integrated circuit device comprising:
  etching a trench into a semiconductor substrate without using a nitride blocking layer;
  depositing a trench-filling oxide layer overlying said semiconductor substrate and filling said trench;
  forming a mask overlying said trench-filling oxide layer having an opening over said trench;
  implanting nitrogen atoms at a tilt angle of 3 to 7 degrees into said trench-filling oxide layer not covered by said mask whereby a layer of nitrogen-rich oxide is formed at the surface of said trench-filling oxide layer overlying said trench;
  thereafter removing said mask; and
  planarizing said trench-filling oxide layer to said semiconductor substrate wherein said nitrogen-rich oxide layer is planarized more slowly than said trench-filling oxide layer resulting in a portion of said trench-filling oxide layer remaining overlying said trench after said trench-filling oxide layer overlying said semiconductor substrate has been removed wherein said portion of said trench-filling oxide layer remaining provides a smooth transition between said shallow trench isolation and said active areas completing said formation of said shallow trench isolation in said fabrication of said integrated circuit device.

22. The method according to claim 21 wherein said trench has a depth of between about 2500 and 3000 Angstroms.

23. The method according to claim 21 further comprising forming a thermal oxide liner layer within said trench before said step of depositing said trench-filling oxide layer.

24. The method according to claim 21 wherein said trench-filling oxide layer is deposited to a thickness of between about 6000 and 8000 Angstroms.

25. The method according to claim 21 wherein said nitrogen atoms are implanted at a dosage of between about 1 E 16 and 1 E 18 atoms/cm² at an energy of between 5 and 20 KeV.

26. The method according to claim 21 wherein said step of forming said nitrogen-rich oxide layer comprises:
  annealing said substrate whereby said layer of nitrogen-rich oxide is formed where said nitrogen atoms lie within said trench-filling oxide layer.

27. The method according to claim 21 wherein said step of forming said nitrogen-rich oxide layer comprises:
  implanting nitrogen atoms into said trench-filling oxide layer not covered by said mask at a temperature high enough whereby said layer of nitrogen-rich oxide is formed in said trench-filling oxide layer not covered by said mask.

28. The method according to claim 21 wherein said nitrogen-rich oxide layer has a thickness of between about 200 and 500 Angstroms.

29. The method according to claim 21 wherein said step of planarizing said trench-filling oxide layer comprises chemical mechanical polishing (CMP).

30. The method according to claim 21 wherein said step of planarizing said trench-filling oxide layer comprises etch back using a dry oxide etch.

31. The method according to claim 21 further comprising fabricating semiconductor device structures in and on said semiconductor substrate between said shallow trench isolation.

* * * * *